United States Patent [19]

Ludlow et al.

[11] 3,808,468

[45] Apr. 30, 1974

[54] BOOTSTRAP FET DRIVEN WITH ON-CHIP POWER SUPPLY

[75] Inventors: Peter J. Ludlow, Hopewell Junction; Eugenio Tai, Wappingers Falls, both of N.Y.

[73] Assignee: International Business Machines Corporation, Armonk, N.Y.

[22] Filed: Dec. 29, 1972

[21] Appl. No.: 319,569

[52] U.S. Cl. ................. 307/304, 307/251, 307/279, 307/297, 307/303

[51] Int. Cl. .. H03k 3/282, H03k 17/10, H011 19/00

[58] Field of Search ...... 321/15; 307/251, 270, 279, 307/296, 297, 303, 304

[56] References Cited

UNITED STATES PATENTS

| | | | |
|---|---|---|---|
| R27,305 | 3/1972 | Polkinghorn et al. | 307/251 |
| 3,601,637 | 8/1971 | Spence | 307/304 |
| 3,629,618 | 12/1971 | Fuijimoto | 307/269 |
| 3,631,267 | 12/1971 | Heimbigner | 307/270 |
| 3,673,438 | 6/1972 | Lund | 307/270 |
| 2,956,183 | 10/1960 | Culbertson | 321/15 X |
| 3,660,827 | 5/1972 | Tickle | 307/279 X |

OTHER PUBLICATIONS

Frantz et al., IBM Tech. Discl. Bull., Vol. 11, No. 10, p. 1219, Mar. 1969, "MOSFET Substrate Bias–Voltage Gen.".

Frantz et al., IBM Tech. Discl. Bull., Vol. 13, No. 8, pp. 2385–2386, Jan. 1971, "MOSFET Substrate Self Biasing".

Lee, IBM Tech. Discl. Bull. "FET Delay Circuit", Vol. 14, No. 4, Sept. 1971, pp. 1082–1083.

Franz, IBM Tech. Discl. Bull., Vol. 12, No. 12, May 1970, p. 2078, "Threshold Voltage Control".

*Primary Examiner*—Rudolph V. Rolinec
*Assistant Examiner*—William D. Larkins
*Attorney, Agent, or Firm*—Robert J. Haase

[57] ABSTRACT

A bootstrap FET driver amplifier having a precharged relatively higher gate voltage and a relatively lower drain voltage obtained from a common power source. The gate voltage is derived from recurrent pulses produced by an on-chip FET free-running multi-vibrator and a voltage multiplier circuit powered from said power source. The pulse width of the recurrent pulses varies as an inverse function of the transconductance of the on-chip FETs and as a direct function of the threshold voltage of the on-chip FETs. The pulse width controls the charging time of a voltage booster capacitor in the voltage multiplier circuit whereby the amplitude of the boosted voltage is a direct function of the pulse width. The boosted voltage is applied to the gate of the bootstrap FET driver amplifier.

6 Claims, 2 Drawing Figures

PATENTED APR 30 1974 3,808,468

BOOTSTRAP FET DRIVEN WITH ON-CHIP POWER SUPPLY

BACKGROUND OF THE INVENTION

1. Field of the Invention

The invention generally relates to bootstrap FET driver amplifiers and, more particularly, to such amplifiers provided with a precharged gate voltage which is higher than the drain voltage.

2. Description of the Prior Art

Bootstrap FET driver amplifiers are employed to deliver current pulses to capacitive loads in integrated circuits. For example, such amplifiers are used to drive the bit-sense lines of storage arrays of individual FET storage cells. It is desired that the bootstrap FET driver amplifier be operated in its linear region so as to rapidly charge the capacitive load while minimizing average power dissipation.

It is well understood that linear operation of the driver amplifier is achieved by placing a potential on the gate of the FET which is higher by at least the amount of a threshold voltage than the drain potential. Ordinarily, nominally fixed gate and drain potentials from separate sources produce satisfactory operation of a given design driver amplifier provided that variations in the transconductance and threshold voltage characteristics of the FETs (due to FET process variations) are within specific and known limits and provided that the two power supplies track each other in voltage amplitude. Uniformity in performance thus is a function of the extent of variation of the FET parameter values and the degree of tracking of the gate and drain power supplies.

SUMMARY OF THE INVENTION

Increased uniformity of performance of a bootstrap FET driver amplifier, i.e., uniformity of the current waveform delivered thereby, is achieved for given variations in FET parameter values and in power supply voltage amplitudes by the provision of an on-chip FET power supply for the FET driver amplifier. The on-chip power supply comprises an FET free-running multivibrator and an FET voltage multiplier circuit. The multivibrator produces recurrent output pulses having a width inversely proportional to FET transconductance and directly proportional to FET threshold voltage. The voltage multiplier circuit includes a voltage booster capacitor whose charging time is controlled by the aforesaid pulse width whereby the gate voltage provided by the on-chip power supply varies inversely with FET transconductance and varies directly with FET threshold voltage. All of the FETs comprising the on-chip power supply and the bootstrap driver amplifier connected thereto experience the same process conditions during manufacture so that the transconductance of all of the FETs and the threshold voltages of all of the FETs vary together with variations in the fabrication process parameters. Inasmuch as the output current delivered by the driver amplifier is directly proportional to FET gate voltage and transconductance and inversely proportional to FET threshold voltage, the gate voltage delivered by the on-chip power supply automatically compensates against transconductance and threshold voltage variations to provide a significant improvement in the uniformity of performance of the bootstrap FET driver amplifier.

DESCRIPTION OF THE PREFERRED EMBODIMENT

Figure 1:
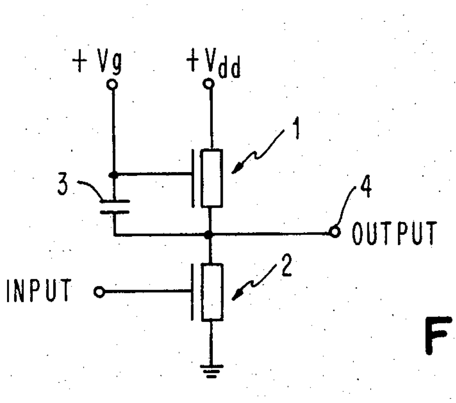
FIG. 1 is a simplified schematic diagram of a conventional bootstrap FET driver amplifier adapted to receive gate and drain operating potentials from separate power supplies.

Referring to FIG. 1, it is well understood that the bootstrap FET driver amplifier comprising FETs 1 and 2 and feedback capacitor 3 is maintained in its preferred linear operating range by applying a potential ($V_g$) to the gate of FET 1 which exceeds by at least the amount of the threshold voltage the potential ($V_{dd}$) applied to the drain thereof. FET 2 is gated on or off to divert current away from or to direct current toward the load (not shown) connected to output terminal 4. The current which is supplied via output terminal 4 is a function of the gate and drain potentials applied to FET 1 and of the transconductance and threshold voltage of FET 1. Generally, the output current of FET 1 varies directly with gate potential and transconductance and inversely with threshold voltage.

It is desirable not only that the gate potential applied to FET 1 be greater by at least the amount of the threshold voltage than the drain potential thereof so as to place FET 1 in its linear range of operation, but also that the gate potential vary in a compensating manner so as to maintain linear operation over a range of different device parameter values, especially transconductance and threshold parameter values. It is further desirable that the gate potential $V_g$ be made a function of the drain potential $V_{dd}$ so that the former tracks variations in the latter. All of the foregoing desiderata are achieved in the embodiment of the present invention depicted in FIG. 2.

Figure 2:
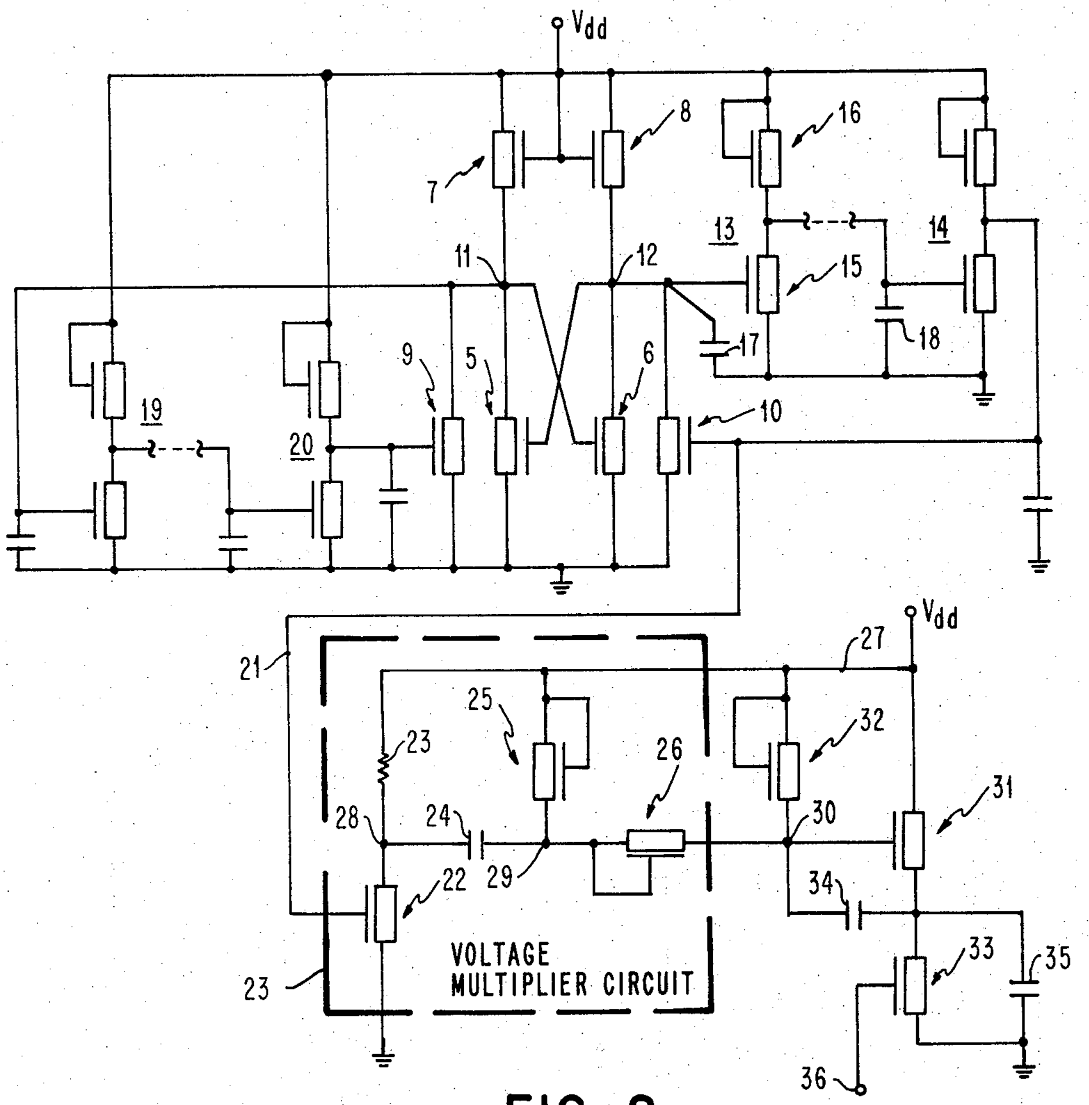
FIG. 2 is a simplified schematic diagram of a preferred embodiment of the present invention.

Referring to FIG. 2, cross-connected FETs 5 and 6 and load-connected FETs 7 and 8 comprise a conventional flip-flop which is set or reset, respectively, by turning on FETs 9 and 10. FETs 9 and 10 are connected between flip-flop switching nodes 11 and 12, respectively, and ground. The conduction of FET 9, for example, lowers the potential of node 11 to ground and forces a corresponding rise in potential at node 12 as is well understood. The rising potential at node 12 is coupled through an even numbered cascaded series of R-C delay line segments such as segments 13 and 14. Each segment comprises two FETs connected in series circuit, such as FETs 15 and 16 connected between the voltage source $V_{dd}$ and ground. FET 16 provides the load for amplifier FET 15 as well as the resistance for the R-C delay network segment which also includes capacitor 18. FET 8 similarly provides the resistance for the R-C delay network segment together with capacitor 17.

After a delay determined by the R-C time constant of the individual delay line segments and the number of delay line segments employed, the rising potential previously mentioned at node 12 is coupled back to the gate of reset FET 10, turning FET 10 on and grounding node 12. The grounding of node 12 forces a rise in potential at node 11 as a consequence of the cross-connection between FET pair 5 and 6. The rising potential at node 11 is coupled back to the gate of set FET 9 following a delay determined by the delay line segments such as segments 19 and 20 interposed between flip-flop switching node 11 and the gate of set FET 9. Generally, the total delay line including segments 19 and 20 is made identical to the total delay line including segments 13 and 14. The arrival of the rising potential at the gate of set FET 9 turns FET 9 on and grounds switching node 11 to complete one cycle of operation of the multivibrator circuit. The multivibrator free-runs with a half period determined by the delay of either one of the previously described delay lines connected between the flip-flop switching nodes and the gates of the set and reset FETs. Inasmuch as the FETs included within the delay line provide the resistance for the R-C delay line segments and provide the gain for charging the capacitors of the next following delay line segment, the amount of delay and, hence, the width of the recurrent pulses provided by the multivibrator circuit, is a function of FET transconductance and FET threshold voltage. Variation of either or both of the transconductance and threshold voltage parameters varies the width of the recurrent pulses. More specifically, pulse width varies inversely with transconductance and directly with threshold voltage variations.

Recurrent output pulses are taken from the multivibrator circuit at the gate of the reset FET 10 and are applied via line 21 to the gate of FET 22 of the voltage multiplier circuit 23. Voltage multiplier circuit 23 further comprises resistor 23, capacitor 24 and diode-connected FETs 25 and 26. FET 22 and resistor 23 are connected in series circuit between $V_{dd}$ and ground. Capacitor 24 and FET 25 are connected in series circuit across resistor 23. The junction between capacitor 24 and FET 25 is connected to node 30 through FET 26.

In operation, the up level of the voltage pulse on line 21 turns on FET 22 and charges capacitor 24 through diode-connected FET 25 toward the potential $V_{dd}$ applied to line 27. Upon the completion of a half cycle of the multivibrator circuit, the down level of the voltage pulse on line 21 turns off FET 22 allowing the node 28 at the drain of FET 22 to rise to the potential $V_{dd}$ through the DC path afforded by resistor 23. Node 29 thus is elevated to a potential approximating twice the potential $V_{dd}$ minus one threshold drop of FET 25. The precise potential to which node 29 is boosted depends both upon the extent to which capacitor 24 is charged and upon the extent to which node 28 charges towards $V_{dd}$. The former depends upon the width of the up level of the voltage pulse on line 21 which controls the conduction of FET 22. The latter depends on the width of the down level of the voltage pulse on line 21 which determines the time that FET 22 is held off. Diode-connected FET 26 isolates capacitor 24 from node 30 at the gate of bootstrap FET 31 during the charging interval but couples node 29 to node 30 following the turning off to FET 22 whereupon the potential at node 29 abruptly rises to a value approximating twice $V_{dd}$ minus one threshold voltage drop of FET 25.

FETs 31 and 33 and capacitor 34 comprise a conventional bootstrap FET driver amplifier which delivers pulses of current to a capacitive load represented by capacitor 35. Diode-connected FET 32 provides an initial charging path for bootstrap capacitor 34, allowing it to charge more rapidly toward the potential $V_{dd}$. The potential at node 30 is driven above the potential of $V_{dd}$ by the above-described action of the voltage multiplier circuit 23.

During the time that FET 33 is gated on by a pulse delivered to terminal 36 at the gate thereof, the current provided by bootstrap FET 31 is diverted to ground and away from the load represented by capacitor 35. With the potential at node 30 already precharged to approximately 2 $V_{dd}$ minus 2 threshold voltage drops (of FETs 25 and 26), and the voltage at the drain of bootstrap FET 31 at the relatively lower potential $V_{dd}$, the pulse at terminal 36 is terminated and current is allowed to flow into the load represented by capacitor 35. The relatively higher potential at the gate of bootstrap FET 31 and the relatively lower potential at the drain thereof place FET 31 into its desired linear range of operation.

In accordance with the present invention, the entire circuit represented by FIG. 2 is fabricated on a common semiconductor chip whereby all of the FET devices experience the same fabrication process. From time to time, however, fabrication process parameters are known to vary within certain tolerance limits resulting in corresponding variation of FET transconductance and threshold voltage. It is desired that bootstrap FET 31 be maintained in its linear range of operation despite such variations of FET transconductance and threshold voltage resulting from process parameter tolerances. This desirable result is achieved in the disclosed embodiment by providing a voltage at node 30 at the gate of bootstrap FET 31 which varies in a compensating manner as a proper function of the aforesaid FET parameter value variations.

It will be noted by those skilled in the art that other multivibrator circuit designs than the one described in the preferred embodiment such as, for example, a ring oscillator, may be employed for delivering recurrent pulses to voltage multiplier circuit 23. It is required, however, that the width of each pulse varies inversely with FET transconductance and directly with FET threshold voltage of the FETs included within the bootstrap FET driver amplifier.

While this invention has been particularly described with reference to the preferred embodiments thereof, it will be understood by those skilled in the art that the foregoing and other changes in form and details may be made therein without departing from the spirit and scope of the invention.

What is claimed is:

1. Apparatus comprising:
a boot strap field effect transistor driver formed in an integrated circuit, said driver having gate, drain and source electrodes,
a source of voltage coupled to said drain electrode,
on-chip means formed in said integrated circuit for delivering a gate voltage higher than said voltage of said source; said means comprising
a multi-vibrator coupled to said source and producing an output recurrent pulsed waveform, the width of said waveform varying inversely with the transconductance of and directly with the threshold voltage of said field effect transistor driver,
a voltage multiplier circuit including a voltage booster capacitor,
switching means in said multiplier circuit coupled to receive said pulsed waveform for controlling the charging time of said capacitor, said capacitor being charged by said source when said switching means is conductive, one side of said capacitor being selectively coupled to said source when said switching means is conductive and the other side of said capacitor being coupled to said source when said switching means is not conductive; and means for coupling said one side of said capacitor to said gate electrode of said boot strap driver.

2. The apparatus defined in claim 1 wherein said voltage multiplier circuit comprises field effect transistors.

3. The apparatus defined in claim 1 wherein said means for coupling comprises a diode-connected field effect transistor poled to isolate said capacitor from said gate electrode when said capacitor is being charged.

4. The apparatus defined in claim 1 wherein said multivibrator circuit comprises a cascaded plurality of resistance-capacitance delay network segments, each segment comprising a pair of field effect transistors connected in series circuit to said source, one of said field effect transistors being diode-connected, and a capacitor connected to the junction between said pair of field effect transistors.

5. The apparatus defined in claim 1 wherein said multivibrator circuit comprises a pair of cross-connected field effect transistors respectively shunted by a pair of set and reset field effect transistors, said field effect transistors having gate, drain and source electrodes, and a pair of resistance-capacitance delay networks respectively coupled between the drain and gate electrodes of said set and reset field effect transistors.

6. The apparatus defined in claim 5 wherein each said resistance-capacitance delay network comprises a cascaded plurality of resistance-capacitance delay network segments, each segment comprising a pair of field effect transistors connected in series circuit to said source, one of said field effect transistors being diode-connected, and a capacitor connected to the junction between said pair of field effect transistors.

* * * * *